（12） United States Patent
Cho et al.

(10) Patent No.: US 7,215,592 B2
(45) Date of Patent: May 8, 2007

(54) MEMORY DEVICE WITH REDUCED WORD LINE RESISTANCE

(75) Inventors: Beak-Hyung Cho, Osan-si (KR); Du-Eung Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 177 days.

(21) Appl. No.: 11/035,205

(22) Filed: Jan. 12, 2005

(65) Prior Publication Data

US 2005/0270883 A1    Dec. 8, 2005

(30) Foreign Application Priority Data

Jun. 8, 2004    (KR)    ...................... 10-2004-0041678

(51) Int. Cl.
G11C 8/00    (2006.01)
G11C 7/00    (2006.01)

(52) U.S. Cl. .................... 365/230.06; 365/63; 365/163

(58) Field of Classification Search .......... 365/230.06, 365/63, 163

See application file for complete search history.

(56) References Cited

U.S. PATENT DOCUMENTS

| 5,337,279 | A   |   | 8/1994 | Gregory et al. ............. 365/201 |
| 5,808,500 | A   |   | 9/1998 | Kalpakjian ................... 327/321 |
| 5,896,344 | A   | * | 4/1999 | Kirsch et al. .......... 365/230.06 |
| 6,031,784 | A   | * | 2/2000 | Ong ...................... 365/230.06 |
| 6,850,432 | B2  | * | 2/2005 | Lu et al. ...................... 365/163 |
| 7,009,908 | B2  | * | 3/2006 | Fischer .................. 365/230.06 |
| 2003/0002338 | A1 |   | 1/2003 | Xu et al. |
| 2003/0133325 | A1 |   | 7/2003 | Silvagni et al. |

* cited by examiner

*Primary Examiner*—Son Dinh
(74) *Attorney, Agent, or Firm*—Monica H. Choi

(57) ABSTRACT

A memory device includes a plurality of blocks, with each block having a respective array of memory cells and respective local word lines. The memory device also includes a respective switching device coupled between each local word line and a common voltage node. A global word line driver controls the respective switching devices to turn on for respective local word lines in a row across the blocks including an accessed memory cell. Thus, the common voltage node is in the current path of the accessed memory cell with minimized layout area and resistance of the current path.

19 Claims, 4 Drawing Sheets

MEMORY DEVICE WITH REDUCED WORD LINE RESISTANCE

BACKGROUND OF THE INVENTION

This application claims priority to Korean Patent Application No. 2004-41678, filed on Jun. 8, 2004, in the Korean Intellectual Property Office, the disclosure of which is hereby incorporated by reference in its entirety.

1. Field of the Invention

The present invention relates generally to memory devices, and more particularly to reducing resistance of a word line in a current path of an accessed memory cell.

2. Description of the Related Art

A PRAM (Phase-change Random Access Memory) device is being developed as one of the next-generation memory devices for higher performance and lower power consumption. A PRAM device is a nonvolatile memory device for storing data by using a phase change material such as $Ge_xSb_yTe_z$ (hereinafter referred to as 'GST').

The resistance of the phase change material is controlled by changing the state of the phase change material to be amorphous or crystalline. Such a state may be controlled by temperature adjustment. The phase change material has higher resistance when in the amorphous state and has lower resistance when in the crystalline state.

When the phase change material is "RESET", the phase change material is changed from a crystalline state to an amorphous state. On the other hand, when the phase change material is "SET", the phase change material is changed from an amorphous state to a crystalline state.

For adjusting temperature, a laser beam may be used. Alternatively, joule heating is generated by applying current to a heater. In the case of joule heating, current density and the time period of current application through the heater determines the amount of heat generated for controlling whether the phase change material is crystallized or becomes amorphous. In any case, the phase change material stores bit information with such two distinct crystalline and amorphous states within a memory device.

FIG. 1 shows a memory cell for a diode type of PRAM device. Referring to FIG. 1, the memory cell includes a diode D1 and a variable resistor element GST. The diode D1 is coupled between a word line WL and the variable resistor element GST. In FIG. 1, a cathode of the diode D1 is coupled to the word line WL, and an anode of the diode D1 is coupled to one end of the variable resistor element GST. Another end of the variable resistor element GST is coupled to a bit line BL. The variable resistor element GST is comprised of a phase change material.

FIG. 2 shows a circuit diagram of a conventional PRAM device comprised of an array of memory cells, with each memory cell similar to FIG. 1. Referring to FIG. 2, the PRAM device includes a word line driver 20, a plurality of word lines WL0, WL1 and WL2, an array of memory cells 10, and a plurality of bit lines BL0, BL1, . . . , BLk-1 and BLk.

Further referring to FIG. 2, the memory cells in a same row are coupled to a same one of the word lines WL0, WL1 and WL2. The memory cells in a same column are coupled to a same one of the bit lines BL0, BL1, . . . , BLk-1 and BLk.

For driving each word line, the word line driver 20 includes a respective NOR gate 22 and a respective inverter comprised of an NMOS transistor 26 and a PMOS transistor 24. The output of the respective NOR gate 22 generates a signal for providing a path of current 40 through the respective inverter with the path of current 40 also being through an accessed memory cell 10 and the bit line BLk of the accessed memory cell 10.

Operation of the PRAM device of FIG. 2 is now described. For accessing the example memory cell 10, a corresponding column selection signal Yk among column selection signals Y0, Y1, . . . , Yk-1 and Yk is enabled. The memory cell 10 is accessed for performing any of typical operations such as a read or write operation on the memory cell 10. A column selection transistor controlled by the enabled column selection signal Yk applies current 40 to the accessed memory cell 10. Such a current 40 is applied from a (write driver)/SA(Sense Amplifier) 30 to the accessed memory cell 10 via the bit line BLk.

The word line driver 10 processes an address signal GWLb and a block selection signal SiEib to couple a word line WL0 for the accessed memory cell 10 to a ground node. Thus, the word line WL0 and the ground node become within a current path 40 for the current flowing through the accessed memory cell 10.

The level of current 40 flowing through the accessed memory cell 10 depends on the resistance of the variable resistor element GST1 within the accessed memory cell 10. If the phase change material of the variable resistor element GST1 has a 'reset' state, the variable resistor element GST1 has a high resistance for a lower level of current 40 flowing through the accessed memory cell 10. On the other hand, if the phase change material of the variable resistor element GST1 has a 'set' state, the variable resistor element GST1 has a low resistance for a higher level of current 40 flowing through the accessed memory cell 10. Such variable current levels indicate the bit information stored within the memory cell 10.

In the PRAM device of the prior art in FIG. 2, the length of each of the word lines W0, WL1 and WL2 is relatively long. For example, each of the word lines W0, WL1 and WL2 may run through a row of memory cells disposed within multiple blocks of memory cells. With such a long word line WL0, current flowing through the accessed memory cell 10 is reduced by word line resistance R_wl. Such reduced current may result in an erroneous read/write operation for the accessed memory cell 10.

To solve such a problem, the main array of memory cells has been divided into a plurality of blocks having less memory cells. In the prior art, a word line driver similar to the word line driver 20 of FIG. 2 is fabricated for each such block, for reducing a word line resistance. However, a large number of the word line drivers are used with each block having a separate word line driver implemented with logical gates such as an inverter, a NAND gate, and/or a NOR gate. Such a large number of word line drivers disadvantageously occupy a large layout area.

SUMMARY OF THE INVENTION

Accordingly, a memory device is formed with reduced word line resistance and minimized layout area.

In a general aspect of the present invention, a memory device includes a plurality of blocks. Each block has a respective array of memory cells and respective local word lines. In addition, the memory device includes a respective switching device coupled between each local word line and a common voltage node. Furthermore, a global word line driver is coupled to the respective switching devices and controls the respective switching device for a respective local word line of an accessed memory cell to turn on such that the common voltage node is in the current path of the accessed memory cell.

In another embodiment of the present invention, the global word line driver turns on the respective switching devices in a row across the blocks including the accessed memory cell.

In an example embodiment of the present invention, each respective switching device is a MOSFET (metal oxide semiconductor field effect transistor). In a further embodiment of the present invention, the current path also includes a bit line of the accessed memory cell.

The present invention may be practiced to particular advantage when the memory device is a PRAM (phase-change random access memory) device. In that case, each memory cell is comprised of a variable resistor element coupled to a diode. A cathode of the diode is coupled to a respective local word line, and an anode of the diode is coupled to the variable resistor element. In addition, the variable resistor element is comprised of a phase change material.

In this manner, just a respective switching device such as a MOSFET is coupled to each local word line and just one global driver controls such switching devices for minimized layout area. In addition, with division of the memory cells into blocks and shorter local word lines, the resistance of the local word line in the current path of the accessed memory cell is reduced.

Although the present invention is described for a PRAM (phase-change random access memory) device, the present invention may also be practiced in other types of memory devices.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, and 4 refer to elements having similar structure and/or function.

DETAILED DESCRIPTION OF THE INVENTION

Figure 3:
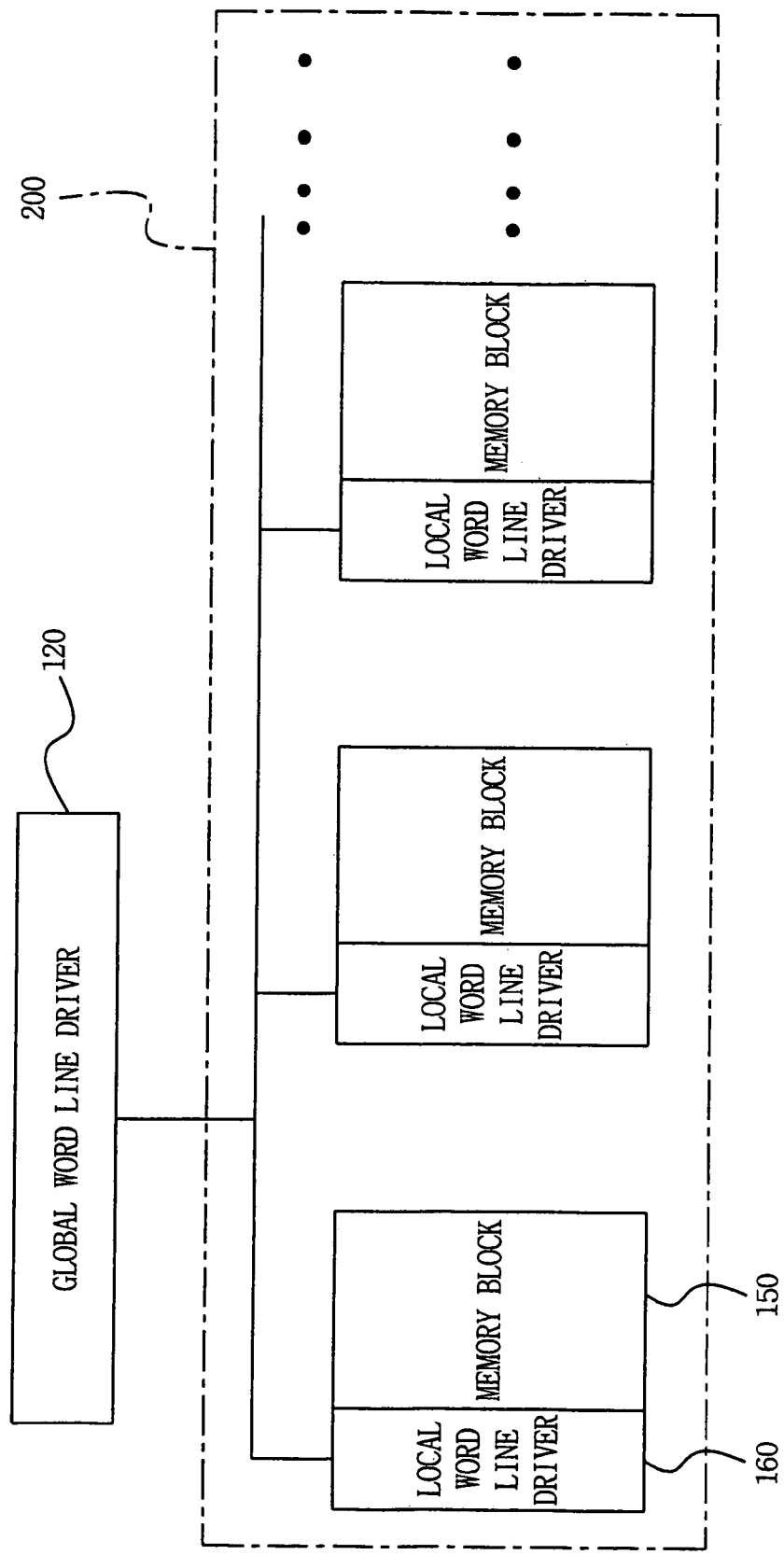
FIG. 3 shows a block diagram of a memory device including local word line drivers and a global word line driver for reducing word line resistance, according to an embodiment of the present invention.

FIG. 3 is a block diagram of a semiconductor memory device according to an embodiment of the present invention. The semiconductor memory device of FIG. 3 includes a global word line driver 120, local word line drivers 160, and memory blocks 150.

The local word line drivers 160 are controlled by a global word line driver 120. Each memory block 150 is coupled to a respective local word line driver 160. Each memory block 150 is comprised of a sub-array of memory cells. The local word line drivers 160 and the memory blocks 150 form a main array 200 of memory cells for the semiconductor memory device of FIG. 3.

Figure 4:
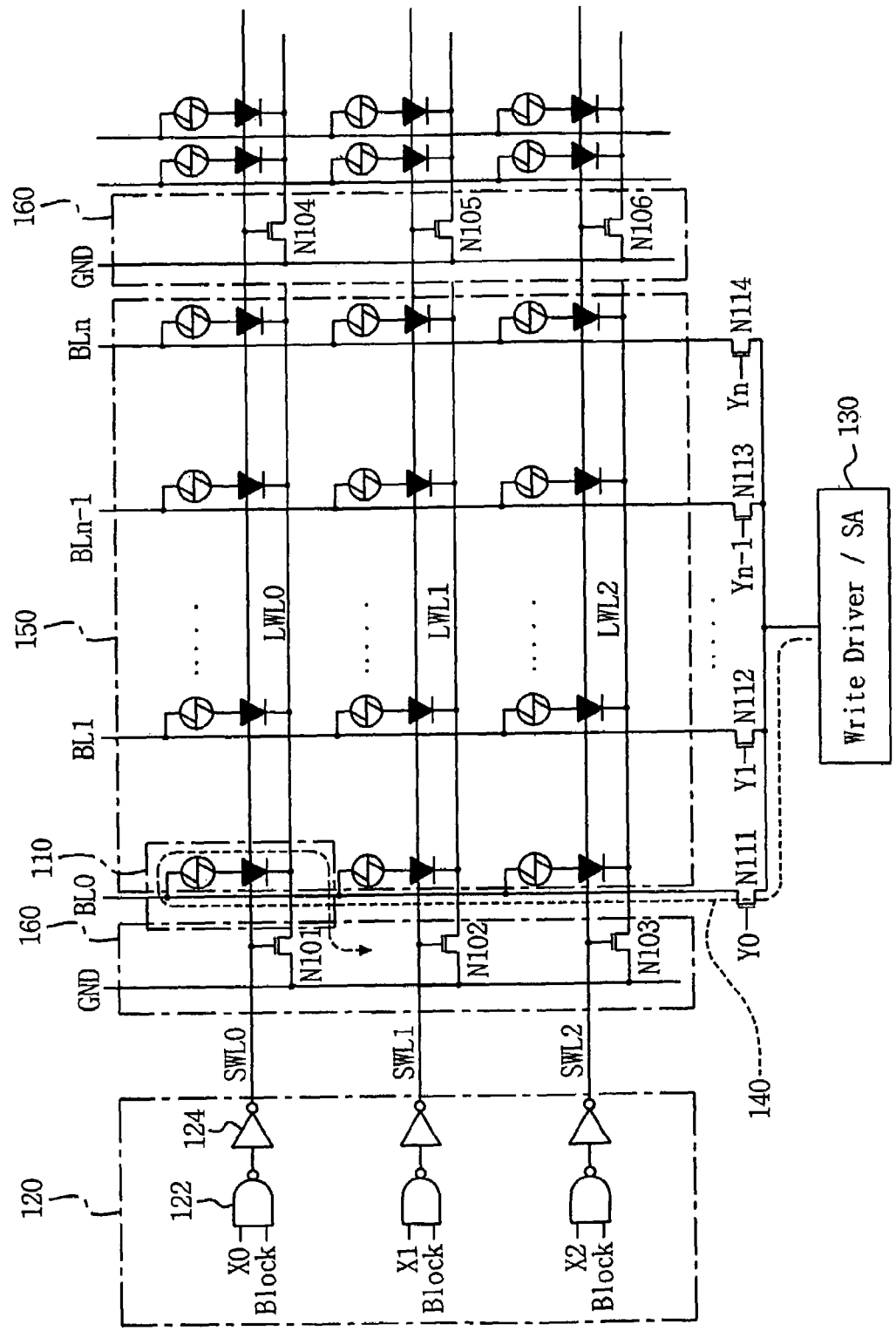
FIG. 4 shows a circuit diagram of the memory device of FIG. 3 for reducing word line resistance, according to an embodiment of the present invention.

FIG. 4 shows a circuit diagram of elements of the semiconductor memory device of FIG. 3, including an example memory block 150 and examples local word line drivers 160, and the global word line driver 120. Referring to FIG. 4, the memory block 150 includes an array of memory cells 110 arranged in rows and columns.

In addition, the memory block 150 also includes a plurality of local word lines LWL0, LWL1, and LWL2. The memory cells 110 along a same row within the memory block 150 are coupled to a same one of the local word lines LWL0, LWL1, and LWL2. The memory cells 110 along a same column within the memory block 150 are coupled to a same one of the bit lines BL0, BL1, ..., BLn-1, and BLn.

Figure 1:
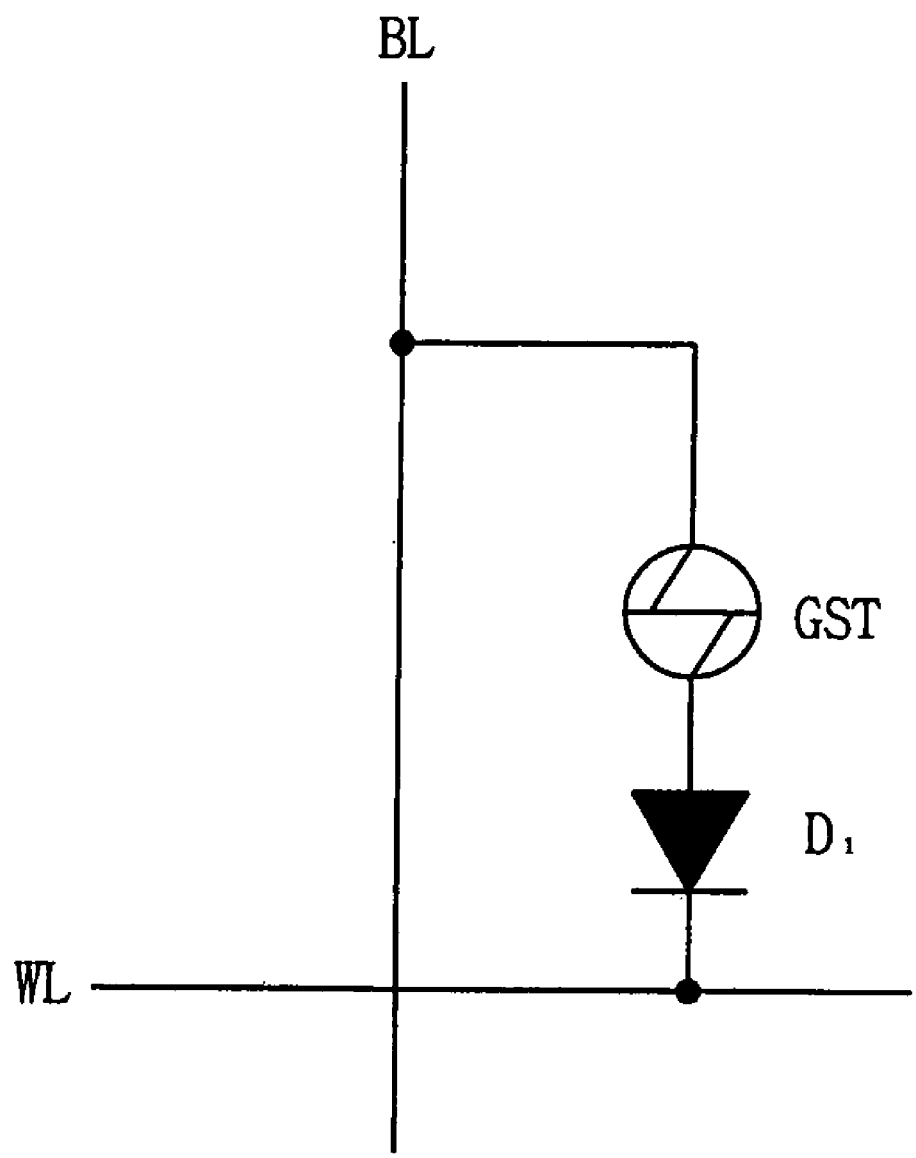
FIG. 1 shows a circuit diagram of a memory cell of a PRAM (phase-change random access memory) device, according to the prior art.
Figure 2:
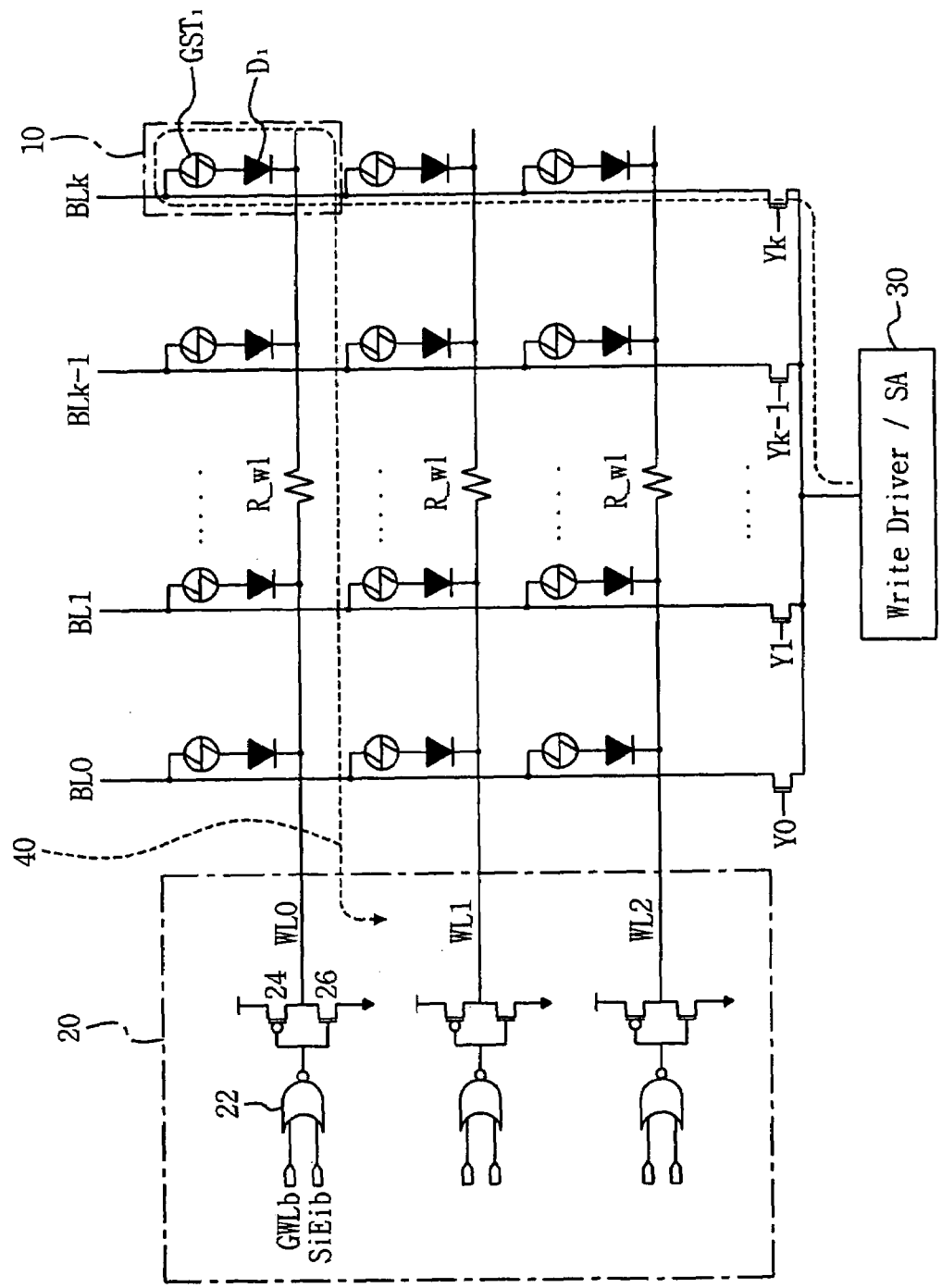
FIG. 2 shows a circuit diagram of a PRAM device including memory cells of FIG. 1, with high word line resistance according to the prior art.

In an example embodiment of the present invention, the memory device of FIGS. 3 and 4 is a PRAM (phase-change random access memory) device. In that case, each memory cell 110 is similar to FIG. 1 and is comprised of a variable resistor element GST and a diode D1. The cathode of the diode is coupled to a respective local word line, and the anode of the diode is coupled to one end of the variable resistor element. The other end of the variable resistor element is coupled to a respective bit line. The variable resistor element GST is comprised of a phase change material.

Each of local word lines LWL0, LWL1 and LWL2 is connected to a predetermined number of memory cells within the memory block 150. Such a predetermined number of memory cells within the memory block 150 is lower than in the prior art for shortening the length of each local word line LWL0, LWL1 or LWL2.

The local word line driver 160 includes a respective switching device N101, N102, or N103 connected between each one of the local word lines LWL0, LWL1 or LWL2 and a common voltage node. In one embodiment of the present invention, the common voltage node is a ground node GND.

Similarly, another local word line driver 160 disposed to the right of the memory block 150 includes a respective switching device N104, N105, or N106 connected between each one of the local word lines in a next memory block to the right of the memory block 150 and the common voltage node GND. In this manner, a respective switching device is connected between each local word line and the common voltage node GND.

The global word line driver 120 controls each respective switching device, connected between each local word line and the common voltage node GND, to turn on or off. Each such respective switching device (such as N101, N102, N103, N104, N105, or N106) is an NMOSFET (N-channel metal oxide semiconductor field effect transistor) in an embodiment of the present invention.

Referring to FIG. 4, the global word line driver 120 includes a respective NAND gate 122 and a respective inverter 124 for generating a respective word line enable signal for each row of memory cells across the memory blocks. Such a respective word line enable signal is applied on a respective one of a plurality of global word lines SWL0, SWL1 and SWL2 running across the memory blocks. Each NAND gate 122 inputs an address bit X0, X1 or X2 and a block selection control bit Block for generating the respective word line enable signal.

In addition, a respective bit line switching device N111, N112, N113 or N114 is coupled to each bit line BL0, BL1, ..., and BLn-1, and BLn. Each bit line switching device N111, N112, N113 or N114 is turned on or off depending on a respective address signal Y0, Y1, Yn-1 or Yn applied thereon. One bit line switching device N111, N112, N113 or N114 is turned on for coupling a corresponding bit line BL0, BL1, BLn-1 or BLn to a (write driver)/(sense amplifier) 130.

The operation of the memory device of FIG. 4 for reducing word line resistance is now described. An example memory cell 110 is accessed for a read/write operation. The X-address bits X0, X1, X2 and the Y-address bits Y0, Y1, ..., Yn-1, and Yn are set for indicating the location of the accessed memory cell 110. Thus, the X-address bit X0 and the Y-address bit Y0 are activated to a logical high state "1" while the other address bits X1, X2, Y1, ..., Yn-1, and Yn are deactivated to the logical low state "0". In addition, the block selection control signal Block is activated to the logical high state "1".

In that case, the global word line driver 120 activates the respective word line enable signal applied on the global word line SWL0 to the logical high state "1". On the other hand, the respective word line enable signal applied on the other word lines SWL1 and SWL2 is deactivated to the logical low state "0".

In addition, the respective bit line switching device N111 coupled to the bit line BL0 of the accessed memory cell 110 is turned on for coupling that bit line BL0 to the (write driver)/(sense amplifier) 130. On the other hand, the other bit line switching devices N112, N113, and N114 are turned off.

With the respective word line enable signal applied on the global word line SWL0 activated to the logical high state "1", the switching devices N101 and N104 in a row of the accessed memory cell 110 are turned on across the plurality of memory blocks 150. Thus, each local word line LWL0 in the row of the accessed memory cell 110 is connected to the common voltage node GND via a respective switching device N101 or N104 in each of the memory blocks 150.

Thus, a current path (outlined with a dashed line 140 in FIG. 4) through the accessed memory cell 110 is also through the local word line LWL0 connected to the accessed memory cell 110. In addition, such a current path 140 is also through the common voltage node GND via the respective switching device N101 coupled to the local word line LWL0. Furthermore, such a current path 140 is through the bit line BL0 to/from the (write driver)/(sense amplifier) 130 for a read/write operation.

In this manner, the memory device of FIG. 4 has multiple points of connection to the common voltage node GND via the multiple switching devices N101 and N104 interspersed between shorter local word lines across the row having the accessed memory cell 110. Thus, such a shorter local word line provides a path 140 of reduced resistance for the current flowing through the accessed memory cell 110. The reduced resistance of the word line is advantageous for preventing erroneous read/write operations. Additionally, because the local word line drivers 160 are comprised of just a respective NMOSFET for each local word line, the lay-out area of the memory device of FIG. 4 is minimized.

While the present invention has been particularly shown and described with reference to exemplary embodiments thereof, it will be understood by those of ordinary skill in the art that various changes in form and details may be made therein without departing from the spirit and scope of the present invention as defined by the following claims.

Thus, the foregoing is by way of example only and is not intended to be limiting. For example, although the present invention has been described for the PRAM device, the present invention may also be practiced for other types of memory devices such as an MRAM (Magnetic Random Access Memory) or a flash memory device. In addition, the circuit topology may be modified or components of the circuit may be replaced with other equivalent elements. For example, the MOSFETs herein may be replaced with other switching devices. In addition, any numbers of elements illustrated and described herein are by way of example only.

The present invention is limited only as defined in the following claims and equivalents thereof.

What is claimed is:

1. A memory device, comprising:
   a plurality of blocks, each block having a respective array of memory cells and respective local word lines;
   a respective switching device coupled between each local word line and a common voltage node; and
   a global word line driver, coupled to the respective switching devices, that controls the respective switching device for a respective local word line of an accessed memory cell to turn on such that the common voltage node is in the current path of the accessed memory cell.

2. The memory device of claim 1, wherein each respective switching device is a MOSFET (metal oxide semiconductor field effect transistor).

3. The memory device of claim 1, wherein the global word line driver turns on the respective switching devices in a row across the blocks including the accessed memory cell.

4. The memory device of claim 1, wherein the memory device is a PRAM (phase-change random access memory) device.

5. The memory device of claim 4, wherein each memory cell is comprised of a variable resistor element coupled to a diode.

6. The memory device of claim 5, wherein a cathode of the diode is coupled to a respective local word line, and wherein an anode of the diode is coupled to the variable resistor element.

7. The memory device of claim 5, wherein the variable resistor element is comprised of a phase change material.

8. The memory device of claim 1, wherein the common voltage node is a ground node.

9. The memory device of claim 1, wherein the current path also includes a bit line of the accessed memory cell.

10. The memory device of claim 1, wherein the global word line driver controls the respective switching devices from address bits.

11. The memory device of claim 1, wherein the global word line driver controls the respective switching devices from a block selection control bit.

12. A memory device, comprising:
   a plurality of blocks, each block having a respective array comprised of a plurality of rows and a plurality of columns of memory cells and respective local word lines;
   a respective switching device coupled between each local word line and a common voltage node; and
   means for generating a respective word line enable signal within a global word line driver for turning on a plurality of respective switching devices in a row across the plurality of blocks including an accessed memory cell for coupling a respective word line for the accessed memory cell to the common voltage node in a current path of the accessed memory cell.

13. The memory device of claim 12, wherein each respective switching device for a row of each block of memory cells is only a single MOSFET (metal oxide semiconductor field effect transistor) that is turned on by the respective word line enable signal.

14. The memory device of claim 12, wherein the memory device is a PRAM (phase-change random access memory) device.

15. The memory device of claim 14, wherein each memory cell is comprised of a variable resistor element coupled to a diode.

16. The memory device of claim 15, wherein a cathode of the diode is coupled to a respective local word line, and wherein an anode of the diode is coupled to the variable resistor element.

17. The memory device of claim 15, wherein the variable resistor element is comprised of a phase change material.

18. The memory device of claim 12, wherein the common voltage node is a ground node.

19. The memory device of claim 12, wherein the current path also includes a bit line of the accessed memory cell.

* * * * *